(12) United States Patent
Yamakawa et al.

(10) Patent No.: US 10,483,306 B2
(45) Date of Patent: Nov. 19, 2019

(54) PHOTOELECTRIC CONVERSION ELEMENT AND PHOTOELECTRIC CONVERSION DEVICE

(71) Applicant: SONY CORPORATION, Tokyo (JP)

(72) Inventors: Shinya Yamakawa, Kanagawa (JP); Jun Komachi, Kanagawa (JP); Koji Nagahiro, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 16/086,478

(22) PCT Filed: Feb. 6, 2017

(86) PCT No.: PCT/JP2017/004218
§ 371 (c)(1),
(2) Date: Sep. 19, 2018

(87) PCT Pub. No.: WO2017/169122
PCT Pub. Date: Oct. 5, 2017

(65) Prior Publication Data
US 2019/0074312 A1    Mar. 7, 2019

(30) Foreign Application Priority Data
Mar. 30, 2016   (JP) ................. 2016-067647

(51) Int. Cl.
*G01J 5/20* (2006.01)
*H01L 27/146* (2006.01)
(Continued)

(52) U.S. Cl.
CPC ........ *H01L 27/14621* (2013.01); *G01S 17/08* (2013.01); *H01L 27/146* (2013.01);
(Continued)

(58) Field of Classification Search
CPC ........ H01L 27/14621; H01L 27/14601; H01L 27/00; H01L 31/12; H01L 31/102;
(Continued)

(56) References Cited

U.S. PATENT DOCUMENTS

2002/0117675 A1   8/2002   Mascarenhas
2016/0211325 A1   7/2016   Mori

FOREIGN PATENT DOCUMENTS

JP    S54-59891       5/1979
JP    61106497 A   *  5/1986
(Continued)

OTHER PUBLICATIONS

Modavis et al., "Aluminum-nitrogen isoelectronic trap in silicon," Journal of Applied Physics, vol. 67, No. 1, Jan. 1990, pp. 545-547, abstract only.
(Continued)

*Primary Examiner* — Kiho Kim
(74) *Attorney, Agent, or Firm* — Sheridan Ross P.C.

(57) ABSTRACT

A photoelectric conversion element according to one embodiment of the disclosure includes a photoelectric conversion region inside a semiconductor layer. The photoelectric conversion region includes a region in which a depletion region is to be formed by voltage application to the semiconductor layer. The semiconductor layer has a first main surface and a second main surface. The depletion region converts light into a photoelectron, in which the light enters from side on which the first main surface is disposed. The photoelectric conversion element further includes an isoelectronic trap region in the region in which the depletion region is to be formed.

15 Claims, 12 Drawing Sheets

(51) Int. Cl.
    *H01L 31/10*         (2006.01)
    *H01L 31/12*         (2006.01)
    *H04N 5/232*       (2006.01)
    *H04N 5/33*         (2006.01)
    *G01S 17/08*        (2006.01)
    *H01L 31/102*       (2006.01)

(52) U.S. Cl.
    CPC .... *H01L 27/1461* (2013.01); *H01L 27/14645* (2013.01); *H01L 27/14649* (2013.01); *H01L 31/10* (2013.01); *H01L 31/102* (2013.01); *H01L 31/12* (2013.01); *H04N 5/232* (2013.01); *H04N 5/33* (2013.01)

(58) Field of Classification Search
    CPC ......... H01L 31/101; H01L 31/00; H04N 5/33; H04N 5/335; G01S 17/08
    See application file for complete search history.

(56) References Cited

FOREIGN PATENT DOCUMENTS

| | | |
|---|---|---|
| JP | 2011-243862 | 12/2001 |
| JP | 2004-537159 | 12/2004 |
| WO | WO 2015/033706 | 3/2015 |

OTHER PUBLICATIONS

International Search Report prepared by the Japan Patent Office dated Apr. 13, 2017, for International Application No. PCT/JP2017/004218.

* cited by examiner

PHOTOELECTRIC CONVERSION ELEMENT AND PHOTOELECTRIC CONVERSION DEVICE

CROSS REFERENCE TO RELATED APPLICATIONS

This application is a national stage application under 35 U.S.C. 371 and claims the benefit of PCT Application No. PCT/JP2017/004218 having an international filing date of 6 Feb. 2017, which designated the United States, which PCT application claimed the benefit of Japanese Patent Application No. 2016-067647 filed 30 Mar. 2016, the entire disclosures of each of which are incorporated herein by reference.

TECHNICAL FIELD

The disclosure relates to a photoelectric conversion element and a photoelectric conversion device.

BACKGROUND ART

Photodetectors using semiconductors (e.g., photodiodes and image sensors) are mounted on many apparatuses such as illuminance sensors, digital cameras, video cameras, monitor cameras, photocopiers, and facsimile equipment. Such photodetectors have a P-N junction structure using a P-type semiconductor and an N-type semiconductor, or a P-I-N structure in which an I layer having a low impurity concentration is interposed between a P-type and an N-type. A reverse bias is applied to the P-N junction or the P-I-N structure, to generate a depletion layer. Illuminating the depletion layer with light causes generation of photoelectrons by photoelectric conversion. The generation of the photoelectrons increases a drift current, detection of which allows for detection of the light. Furthermore, so-called CMOS type solid-state imaging elements are in wide use, in which the photodiodes as mentioned above are disposed in an array, and are manufactured by CMOS (Complementary Metal Oxide Semiconductor) processes, together with peripheral circuits (for example, refer to PTL 1).

CITATION LIST

Patent Literature

PTL 1: Japanese Unexamined Patent Application Publication No. 2016-28457

SUMMARY OF INVENTION

In such photodetectors, Si or Ge are used in many cases in view of costs. However, Si and Ge are semiconductors of an indirect transition type and have a concern that sensitivity drops sharply particularly in a near infrared region. A possible measure to be taken to increase sensitivity of such elements in an infrared region is, for example, to thicken a semiconductor layer. In this case, however, it is necessary to implant impurities at large depths or to manufacture with the use of epitaxial growth a plurality of times. Accordingly, there is a concern for cost of manufacture, e.g., necessity of new capital investment or longer time of manufacture. It is desirable to provide a photoelectric conversion element and a photoelectric conversion device that make it possible to enhance sensitivity at low costs.

A photoelectric conversion element according to an embodiment of the disclosure includes a photoelectric conversion region inside a semiconductor layer. The photoelectric conversion region includes a region in which a depletion region is to be formed by voltage application to the semiconductor layer. The semiconductor layer has a first main surface and a second main surface. The depletion region converts light into a photoelectron, in which the light enters from side on which the first main surface is disposed. The photoelectric conversion element further includes an isoelectronic trap region in the region in which the depletion region is to be formed.

A photoelectric conversion device according to an embodiment of the disclosure includes: one or more photoelectric conversion elements; and a driver section that drives the one or more photoelectric conversion elements. The one or more photoelectric conversion elements provided in the photoelectric conversion device each include the same constituent elements as those of the photoelectric conversion element as mentioned above.

In the photoelectric conversion element and the photoelectric conversion device according to the respective embodiments of the disclosure, the isoelectronic trap region is provided in the region in which the depletion region is to be formed. Thus, electrons are trapped in the isoelectronic trap region, which provides rough determination of locations where the electrons are present. This causes expansion of k space by Heisenberg's uncertainty principle. As a result, direct-transition-like generation is carried out, leading to enhancement in photoelectric conversion efficiency.

According to the photoelectric conversion element and the photoelectric conversion device of the respective embodiments of the disclosure, providing the isoelectronic trap region in the region in which the depletion region is to be formed makes it possible to enhance the photoelectric conversion efficiency. This renders it unnecessary to thicken the semiconductor layer. Hence, it is possible to enhance the sensitivity at low costs. It is to be noted that effects of the disclosure are not necessarily limited to the effects described above, and may be any of the effects described herein.

MODES FOR CARRYING OUT THE INVENTION

In the following, some embodiments of the disclosure are described in detail with reference to drawings. It is to be noted that description is given in the following order.

1. First Embodiment (Photoelectric Conversion Element) an example in which a photoelectric conversion region includes a photodiode
2. Second Embodiment (Imaging Device) an example in which a photoelectric conversion region includes a photodiode
3. Third Embodiment (Photoelectric Conversion Element) an example in which a photoelectric conversion region includes a CAPD
(Current Assisted Photonic Demodulator)
4. Fourth Embodiment (Imaging System) an example in which the imaging device of the second embodiment is applied to an imaging system
5. Fifth Embodiment (Distance Measurement Device) an example in which the photoelectric conversion elements of the first and the third embodiments are applied to a distance measurement device
6. Applied Example to Mobile Body

1. First Embodiment

[Configuration]

Figure 1:
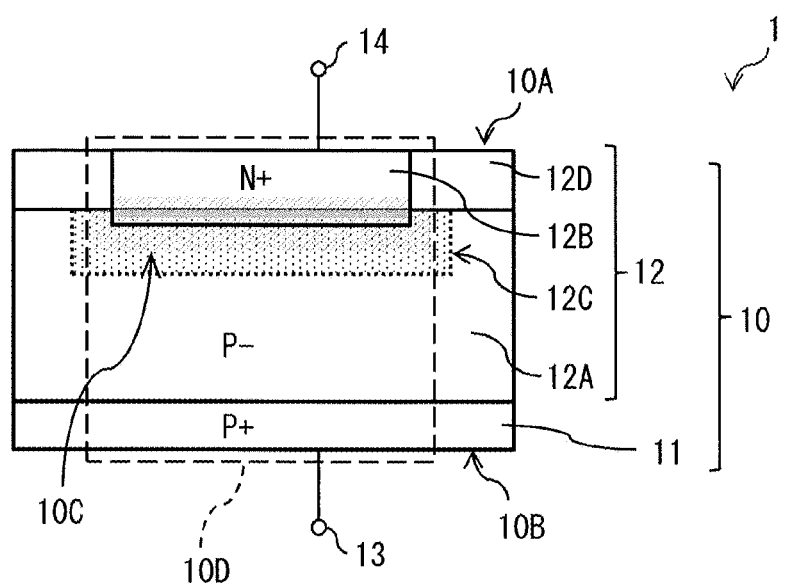
FIG. 1 is a view of an example of a cross-sectional configuration of a photoelectric conversion element according to a first embodiment of the disclosure.

FIG. 1 illustrates an example of a cross-sectional configuration of a photoelectric conversion element 1 according to a first embodiment of the disclosure. The photoelectric conversion element 1 includes a photoelectric conversion region 10D inside a semiconductor layer 10. The photoelectric conversion region 10D includes a region in which a depletion region 10C is to be formed by voltage application to the semiconductor layer 10. The depletion region 10C is a region nearly devoid of electrons or holes as carriers. The depletion region 10C converts light into a photoelectron, in which the light enters from side on which a light receiving surface 10A (first main surface) is disposed. The photoelectric conversion region 10D generates the depletion region 10C by voltage application to the photoelectric conversion region 10D. Upon the light entering the depletion region 10C generated, the photoelectric conversion region 10D converts the photoelectron generated in the depletion region 10C, into a photocurrent. The photoelectric conversion element 1 further includes an IET region 12C in the region in which the depletion region 10C is to be formed.

The photoelectric conversion element 1 includes the semiconductor layer 10 having the light receiving surface 10A and a bottom surface 10B (second main surface) The light receiving surface 10A is covered with, for example, an interlayer insulating film including, for example, wirings. The semiconductor layer 10 includes a substrate 11 and an epitaxial growth layer 12. The substrate 11 constitutes the bottom surface 10B. The epitaxial growth layer 12 constitutes the light receiving surface 10A. The substrate 11 serves as a growth substrate in forming the epitaxial growth layer 12 by an epitaxial crystal growth method in a manufacture process. The epitaxial growth layer 12 is formed by the epitaxial crystal growth method, with the substrate 11 serving as the growth substrate. The substrate 11 and the epitaxial growth layer 12 include, for example, a semiconductor of an indirect transition type, e.g., silicon (Si), germanium (Ge), or a mixed crystal thereof. It is to be noted that in some cases, the substrate 11 is removed by polishing in the manufacture process.

In the following, described is each constituent element formed inside the epitaxial growth layer 12, on an assumption that the substrate 11 and the epitaxial growth layer 12 include a P-type semiconductor.

The epitaxial growth layer 12 includes an N region 12B on the light receiving surface 10A. The N region 12B is in contact with a P region 12A inside the epitaxial growth layer 12. Here, the P region 12A includes a P-type semiconductor, and has, for example, a P-type impurity concentration (e.g., $1 \times 10^{16}$ cm$^{-3}$ to $1 \times 10^{18}$ cm$^{-3}$) lower than a P-type impurity concentration of the substrate 11. The N region 12B includes an N-type semiconductor. The N region 12B is formed by, for example, carrying out ion implantation of arsenide (As) into the epitaxial growth layer 12 at 5 keV to 100 KeV and about $1 \times 10^{14}$ cm$^{-3}$ to $5 \times 10^{15}$ cm$^{-3}$. The substrate 11, the P region 12A, and the N region 12B form the photoelectric conversion region 10D having a P-N structure in a stacking direction in the semiconductor layer 10. Accordingly, the photoelectric conversion region 10D constitutes a photodiode of a P-N type. In this case, the substrate 11 or the P region 12A serves as an anode region, while the N region 12B serves as a cathode region.

The epitaxial growth layer 12 includes an element isolation region 12D in a region other than the N region 12B within the light receiving surface 10A. The element isolation region 12D includes, for example, an STI (Shallow Trench Isolation) including, for example, silicon oxide or other materials. The photoelectric conversion element 1 includes an anode electrode 13 that is electrically coupled to the substrate 11. The photoelectric conversion element 1 further includes a cathode electrode 14 that is electrically coupled to the N region 12B. The anode electrode 13 and the cathode electrode 14 are terminals that apply a reverse bias voltage to the photoelectric conversion region 10D from outside.

The epitaxial growth layer 12 further includes the IET (isoelectronic trap) region 12C in the region in which the depletion region 10C is to be formed, specifically in a region including a P-N junction region of the photoelectric conversion region 10D. The IET region 12C includes aluminum (Al) and nitrogen (N) as impurities. The IET region 12C is formed by, for example, carrying out ion implantation of aluminum (Al) and nitrogen (N) into the epitaxial growth layer 12 at 5 keV to 50 keV and about $1\times10^{16}$ cm$^{-3}$ to $1\times10^{19}$ cm$^{-3}$, and thereafter, annealing at a temperature of 450° C. for about 20 hours to 200 hours. This long-time annealing causes formation of a localized level by an Al—N pair.

[Workings and Effects]

Figure 2:
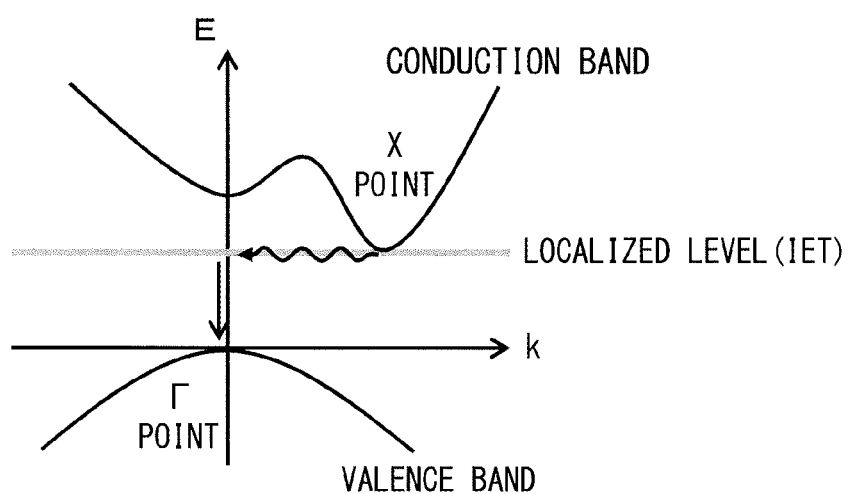
FIG. 2 is a diagram that describes an IET (isoelectronic trap).

Description is given next of workings and effects of the photoelectric conversion element 1. FIG. 2 illustrates energy levels in wave number space in a case where an IET is formed in a semiconductor of an indirect transition type, with Si given as an example. In relation to formation of the IET in Si, details are given in the following Non-Patent Literatures 1 and 2.

Non-Patent Literature 1: R. A. Modavis and D. G. Hall, "Aluminum-nitrogen isoelectronic trap in silicon," J. Appl. Phys. 67, p. 545 (1990)

Non-Patent Literature 2: T. Mori et al., "Band-to-Band Tunneling Current Enhancement Utilizing Isoelectronic Trap and its Application to TFETs," VLSI Tech. Dig. 2014, p. 86 (2014)

According to Non-Patent Literature 2, from a photoluminescence result, energy levels of the IET are 1.126 eV and 1.122 eV at 10K. It is understood that the energy levels of the IET are located just below a conduction band. At this occasion, because the IET is present to be localized, the IET is able to be present to expand in the wave number space, as illustrated in FIG. 2. Usually, in a semiconductor of an indirect transition type, recombination of an electron in the conduction band with a hole involves a phonon as an intermediary by momentum conservation law. However, in a case with presence of the IET, the IET is present to expand in the wave number space. This causes relaxation of the momentum conservation law, allowing an electron at an X point to be trapped by an IET level, and thereafter, to be able to make a transition to a Γ point without involving the phonon as the intermediary. Moreover, in a case with generation of an electron and a hole, there occurs a transition opposite to as described above. Likewise, the phonon as the intermediary is unnecessary.

Figure 3:
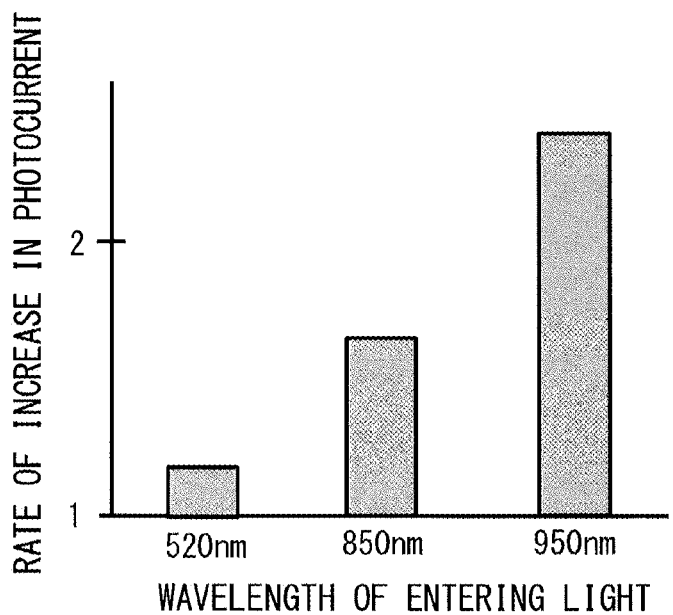
FIG. 3 is a diagram that illustrates an experimental result of wavelength dependency of a rate of increase in a photocurrent by the IET.

Assume that the IET region 12C is formed in the region in which the depletion region 10C is to be formed, specifically in the region including the P-N junction region of the photoelectric conversion region 10D, with the reverse bias voltage being applied to the photoelectric conversion region 10D. In this case, irradiating the light receiving surface 10A of the photoelectric conversion element 1 with light to allow the photoelectric conversion element 1 to perform photoelectric conversion causes a significant increase in photoelectric conversion efficiency (sensitivity). FIG. 3 illustrates an experimental result of wavelength dependency of a rate of increase in a photocurrent by the IET.

First, implantation of As was carried out into a P-type Si substrate, to form an N+ layer over a surface of the P-type Si substrate. The P-type Si substrate had a P-type impurity concentration of about $5\times10^{16}$ cm$^{-3}$. Thereafter, short-time annealing at 1000° C. was carried out to activate a P-type impurity, following which implantation of Al and N was carried out. Thereafter, annealing was carried out at 450° C. for 24 hours, to form the IET region 12C including Al—N near a P-N junction. The sample was irradiated with LED light of various wavelengths. FIG. 3 illustrates summary of the rates of increase in the photocurrent of the sample with the IET region 12C formed, in comparison with one without the IET region 12C formed. From FIG. 3, it is understood that for light of a visible light (green) region of a wavelength 520 nm, the rate of increase in the photocurrent owing to the IET region 12C was about 1.2 times. Moreover, from FIG. 3, obtained were the photocurrents about 1.7 times and 2.4 times respectively for light of wavelengths of 850 nm and 950 nm in a near infrared region. This shows that the sensitivity particularly was enhanced significantly in the near infrared region. Thus, forming the IET region 12C in the photoelectric conversion region 10D makes it possible to enhance the sensitivity of the semiconductor of the indirect transition type, e.g., Si and Ge, from the visible light region to particularly an infrared region.

In this embodiment, the IET region 12C is provided in the region in which the depletion region 10C is to be formed. Thus, during the application of the reverse bias voltage from the anode electrode 13 and the cathode electrode 14 to the photoelectric conversion region 10D, with the depletion region 10C being formed, upon light entering the depletion region 10C to generate photoelectrons in the depletion region 10C, electrons are trapped in the IET region 12C. This results in rough determination of locations where the electrons are present, causing expansion of k space by Heisenberg's uncertainty principle. Thus, direct-transition-like generation is carried out, leading to enhancement in the photoelectric conversion efficiency. This renders it unnecessary to thicken the semiconductor layer 10. Hence, it is possible to enhance the sensitivity at low costs.

In this embodiment, the substrate 11 and the epitaxial growth layer 12 include Si, Ge, or the mixed crystal thereof. Furthermore, the IET region 12C includes Al and N as the impurities. Thus, as is clear from the result of FIG. 3, the direct-transition-like generation is effectively carried out, making it possible to enhance the photoelectric conversion efficiency. This renders it unnecessary to thicken the semiconductor layer 10. Hence, it is possible to enhance the sensitivity at low costs.

In this embodiment, the photoelectric conversion region 10D includes the photodiode in which the P-N structure is formed in the stacking direction in the semiconductor layer 10. Here, because the IET region 12C is formed by the ion implantation, setting implantation energy makes it possible to form the IET region 12C with respect to the P-N junction region that is distributed in an in-plane direction of stacked layers. This renders it unnecessary to thicken the semiconductor layer 10. Hence, it is possible to enhance the sensitivity at low costs.

Figure 4:
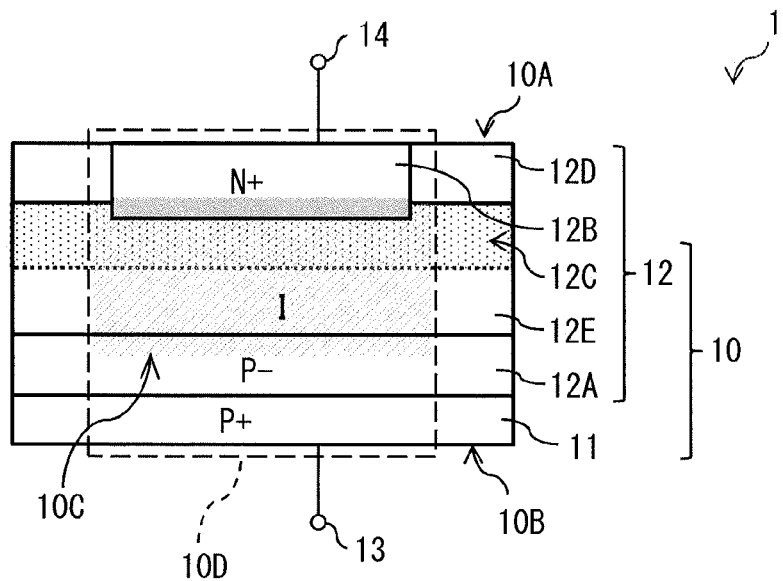
FIG. 4 is a view of a modification example of the cross-sectional configuration of the photoelectric conversion element illustrated in FIG. 1.

In this embodiment, for example, as illustrated in FIG. 4, the semiconductor layer 10 may include an I region 12E between the P region 12A and the N region 12B. The I region 12E has an impurity concentration of $1\times10^{16}$ cm$^{-3}$ or less. In this case, the I region 12E is in contact with both the P region 12A and the P region 12A. The substrate 11, the P region 12A, the I region 12E, and the N region 12B form the photoelectric conversion region 10D having a P-I-N structure in the stacking direction in the semiconductor layer 10. Accordingly, in this case, the photoelectric conversion region 10D constitutes a P-I-N photodiode. As described, even in a case where the photoelectric conversion region 10D constitutes the P-I-N photodiode, the direct-transition-like generation is effectively carried out, leading to the enhancement in the photoelectric conversion efficiency. This renders it unnecessary to thicken the semiconductor layer 10. Hence, it is possible to enhance the sensitivity at low costs. Moreover, in this case, the photoelectric conversion region 10D constitutes the photodiode in which the P-I-N structure is formed in the stacking direction in the semiconductor layer 10. Accordingly, setting the implantation energy makes it possible to form the IET region 12C with respect to a P-I-N junction region that is distributed in the in-plane direction of the stacked layers. This renders it unnecessary to thicken the semiconductor layer 10. Hence, it is possible to enhance the sensitivity at low costs.

In this embodiment, the substrate 11 and the epitaxial growth layer 12 may include an N-type semiconductor. In this case, an electrical-conductivity type of each constituent element inside the epitaxial growth layer 12 as mentioned above becomes an opposite electrical-conductivity type. Thus, even in a case with the opposite electrical-conductivity type to the forgoing description, the direct-transition-like generation is effectively carried out, leading to the enhancement in the photoelectric conversion efficiency. This renders it unnecessary to thicken the semiconductor layer 10. Hence, it is possible to enhance the sensitivity at low costs.

Second Embodiment

[Configuration]

Figure 5:
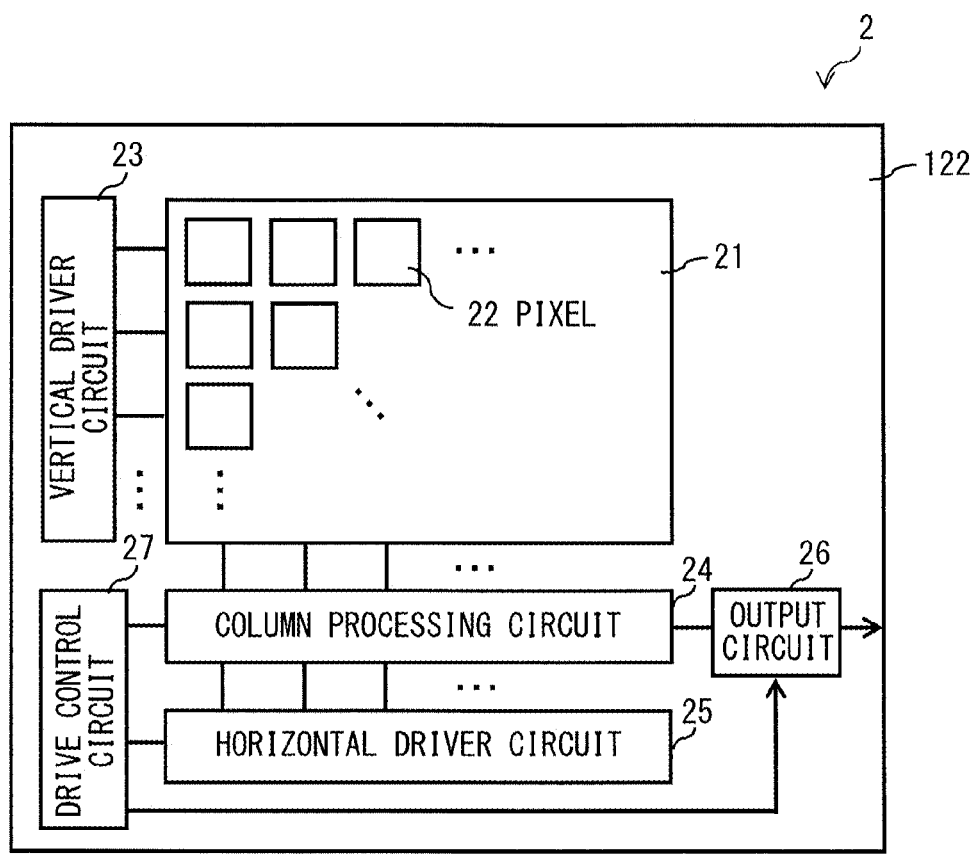
FIG. 5 is a diagram illustrating an example of a schematic configuration of an imaging device according to a second embodiment of the disclosure.

FIG. 5 illustrates an example of a schematic configuration of an imaging device 2 (photoelectric conversion device) according to a second embodiment of the disclosure. The imaging device 2 includes a plurality of photodiodes PD (photoelectric conversion elements) and a driver section that drives the one or more photodiodes PD (photoelectric conversion elements). The plurality of the photodiodes PD share a semiconductor layer 122 with one another, and are two-dimensionally disposed in a light receiving surface 122a (first main surface) of the semiconductor layer 122 shared by the plurality of the photodiodes PD.

The imaging device 2 includes a solid-state imaging element of a CMOS type. The imaging device 2 includes a pixel region 21 and a peripheral circuit. In the pixel region 21, a plurality of pixels 22 are disposed in rows and columns. The imaging device 2 includes, as the peripheral circuit, for example, a vertical driver circuit 23, a column processing circuit 24, a horizontal driver circuit 25, an output circuit 26, and a drive control circuit 27.

The vertical driver circuit 23, for example, sequentially selects the plurality of the pixels 22 in units of rows. The column processing circuit 24, for example, performs correlated double sampling (CDS) processing on a pixel signal outputted from each of the pixels 22 of a row selected by the vertical driver circuit 23. The column processing circuit 24, for example, performs the CDS processing to extract a signal level of the pixel signal, and stores pixel data corresponding to an amount of received light of each of the pixels 22. The horizontal driver circuit 25, for example, allows the pixel data stored in the column processing circuit 24 to be outputted sequentially to the output circuit 26. The output circuit 26, for example, amplifies the pixel data inputted, and outputs the resultant pixel data to an external signal processing circuit. The drive control circuit 27, for example, controls drive of each block inside the peripheral circuit (vertical driver circuit 23, column, processing circuit 24, horizontal driver circuit 25, and output circuit 26).

Figure 6:
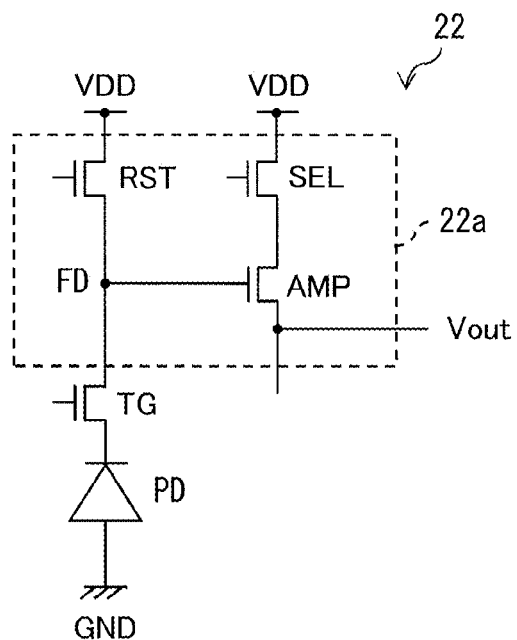
FIG. 6 is a diagram illustrating an example of a circuit configuration of a pixel in FIG. 5.

FIG. 6 illustrates an example of a circuit configuration of the pixel 22. The pixel 22 includes, for example, the photodiode PD, a transfer transistor TG, and a read circuit 22a. The photodiode PD performs the photoelectric conversion to generate an electrical charge corresponding to the amount of received light. The photodiode PD corresponds to the photoelectric conversion element 1 in the forgoing first embodiment. The read circuit 22a may be provided for each of the pixels 22, or alternatively, the read circuit 22a may be shared by the plurality of the pixels 22. The read circuit 22a includes, for example, a floating diffusion section FD, a reset transistor RST, a selection transistor SEL, and an amplification transistor AMP. The floating diffusion section FD accumulates the electrical charges generated in the photodiode PD. The transfer transistor TG, the reset transistor RST, the selection transistor SEL, and the amplification transistor AMP each include a CMOS transistor.

A cathode of the photodiode PD is coupled to a source of the transfer transistor TG. An anode of the photodiode PD is coupled to a reference potential line (e.g., ground). A drain of the transfer transistor TG is coupled to the floating diffusion section FD. A gate of the transfer transistor TG is coupled to the vertical driver circuit 23. A source of the reset transistor RST is coupled to the floating diffusion section FD. A drain of the reset transistor RST is coupled to a power supply line VDD and a drain of the selection transistor SEL. A gate of the reset transistor RST is coupled to the vertical driver circuit 23. A source of the selection transistor SEL is coupled to a drain of the amplification transistor AMP. A gate of the selection transistor SEL is coupled to the vertical driver circuit 23. A source of the amplification transistor AMP is coupled to the column processing circuit 24. A gate of the amplification transistor AMP is coupled to the floating diffusion section FD.

Upon the transfer transistor TG turned on, the transfer transistor TG transfers the electrical charges of the photodiode PD to the floating diffusion section FD. Upon the reset transistor RST turned on, the reset transistor RST resets a potential of the floating diffusion section FD to a potential of the power supply line VDD. The selection transistor SEL controls timing at which the pixel signal is outputted from the read circuit 22a. The amplification transistor AMP constitutes an amplifier of a source follower type, and outputs the pixel signal having a voltage corresponding to a level of the electrical charges generated in the photodiode PD. Upon the selection transistor SEL turned on, the amplification transistor AMP amplifies the potential of the floating diffusion section FD, and outputs a voltage corresponding to the resultant potential, to the column processing circuit 24.

Figure 7:
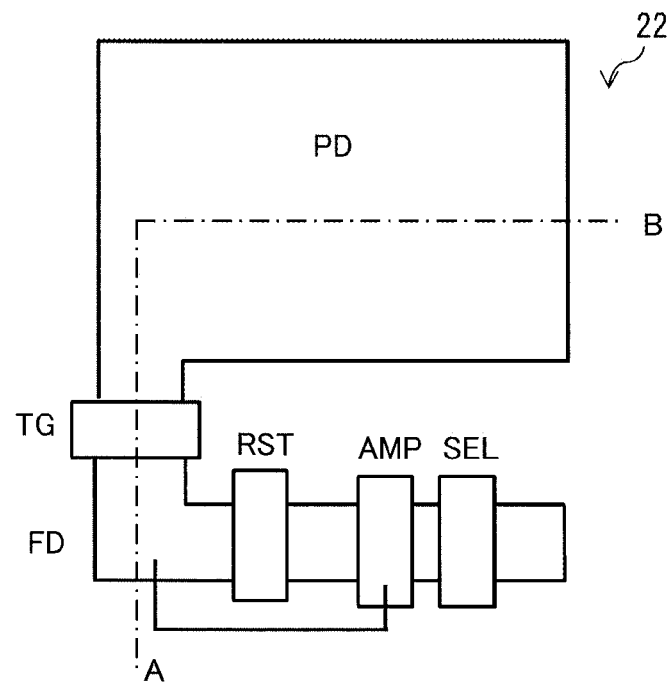
FIG. 7 is a diagram illustrating an example of an in-plane layout of the pixel in FIG. 5.
Figure 8:
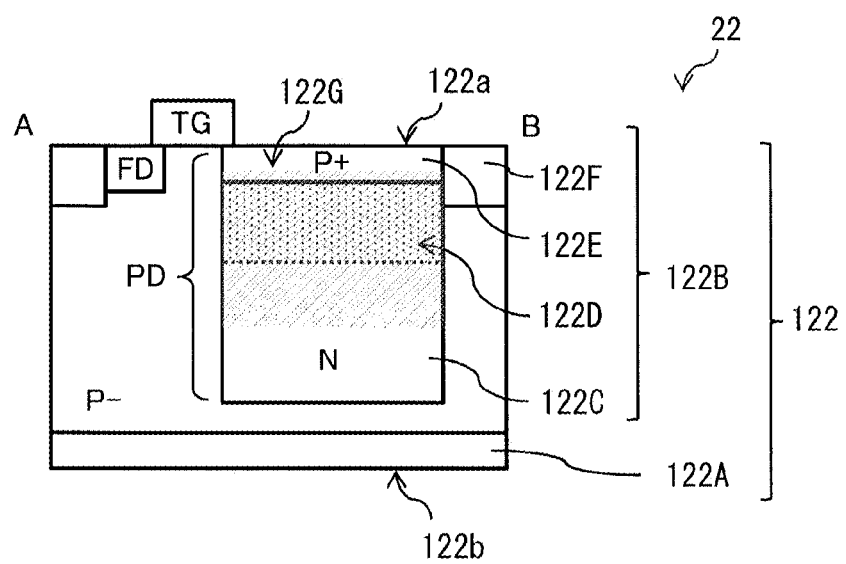
FIG. 8 is a view of an example of a cross-sectional configuration of the pixel in FIG. 5.

FIG. 7 illustrates an example of an in-plane layout of the pixel 22. FIG. 8 illustrates an example of a cross-sectional configuration taken along an A-B line in FIG. 7. The in-plane layout of the pixel 22 is not limited to the layout illustrated in FIG. 7. The cross-sectional configuration of the pixel 22 is not limited either to the cross-sectional configuration in FIG. 8.

The imaging device 2 includes the semiconductor layer 122 having the light receiving surface 122a (first main surface) and a bottom surface 122b (second main surface). The light receiving surface 122a is covered with, for example, an interlayer insulating film including, for example, wirings. The semiconductor layer 122 includes a substrate 122A and an epitaxial growth layer 122B. The substrate 122A constitutes the bottom surface 122b. The epitaxial growth layer 122B constitutes the light receiving surface 122a. The substrate 122A serves as a growth substrate in forming the epitaxial growth layer 122B by the epitaxial crystal growth method in a manufacture process. The epitaxial growth layer 122B is formed by the epitaxial crystal growth method, with the substrate 122A serving as the growth substrate. The substrate 122A and the epitaxial growth layer 122B include, for example, the semiconductor of the indirect transition type, e.g., silicon (Si), germanium (Ge), or a mixed crystal thereof. It is to be noted that in some cases, the substrate 122A is removed by polishing in the manufacture process.

In the following, described is each constituent element formed inside the epitaxial growth layer 122B, on an assumption that the substrate 122A and the epitaxial growth layer 122B include a P-type semiconductor.

The epitaxial growth layer 122B includes a plurality of P regions 122E on the light receiving surface 122a. The epitaxial growth layer 122B includes the N regions 122C directly below the respective P regions 122E on the one-to-one basis. The N regions 122C are in contact with the P regions 122E. Here, the P regions 122E include a P-type semiconductor. The P regions 122E each have, for example, a P-type impurity concentration (e.g., $1 \times 10^{18}$ cm$^{-3}$ to $1 \times 10^{19}$ cm$^{-3}$) higher than a P-type impurity concentration (e.g., $1 \times 10^{16}$ cm$^{-3}$ to $1 \times 10^{18}$ cm$^{-3}$) of a region other than the P regions 122E within the epitaxial growth layer 122B. The N regions 122C include an N-type semiconductor. The N regions 122C are formed by, for example, ion implantation of arsenide (As) into the epitaxial growth layer 122B at 5 keV to 100 keV and about $1 \times 10^{15}$ cm$^{-3}$ to $5 \times 10^{18}$ cm$^{-3}$. The P regions 122E and the N regions 122C form the photoelectric conversion regions each having the P-N structure in a stacking direction in the semiconductor layer 122. Thus, the photoelectric conversion regions each constitute a P-N photodiode (photodiode PD). At this occasion, the P regions 122E serve as cathode regions, while the N regions 122C serve as anode regions. The plurality of the photodiodes PD share the epitaxial growth layer 122B with one another, and are two-dimensionally disposed in the light receiving surface 122a of the epitaxial growth layer 122B shared by the plurality of the photodiodes PD.

The epitaxial growth layer 122B includes element isolation regions 122F in regions other than the respective P regions 122E, within the light receiving surface 122a. The element isolation regions 122F electrically isolate the photodiodes PD in adjacency to each other. The element isolation regions 122F include, for example, silicon oxide or other materials. The epitaxial growth layer 122B includes an IET region 122D in a region in which a depletion region 122G is to be formed, specifically in a region including a P-N junction region of the photoelectric conversion region (photodiode PD). The depletion region 122G is a region nearly devoid of electrons or holes as carriers. The depletion region 122G converts light into a photoelectron, in which the light enters from side on Which the light receiving surface 122a is disposed. The photoelectric conversion region (photodiode PD) generates the depletion region 122G by voltage application to the photodiode PD. Upon the light entering the depletion region 122G generated, the photoelectric conversion region (photodiode PD) converts the photoelectron generated in the depletion region 122G, into a photocurrent.

The IET region 122D includes aluminum (Al) and nitrogen (N) as impurities. The IET region 122D is formed by, for example, carrying out ion implantation of aluminum (Al) and nitrogen (N) into the epitaxial growth layer 122B at 5 keV to 50 keV and about $1 \times 10^{16}$ cm$^{-3}$ to $1 \times 10^{19}$ cm$^{-3}$, and thereafter, annealing at a temperature of 400° C. to 500° C. for about 20 hours to 200 hours. This long-time annealing causes the formation of the localized level by the Al—N pair.

Figure 9A:
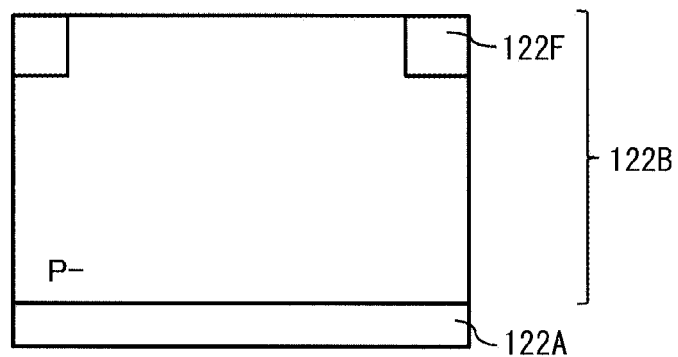
FIG. 9A is a view of an example of a procedure of manufacture of a pixel in FIG. 8.
Figure 9B:
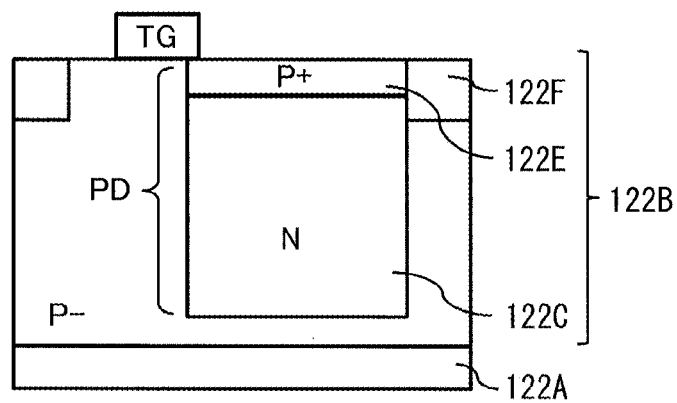
FIG. 9B is a view of an example of the procedure of manufacture following FIG. 9A.

FIGS. 9A to 9E illustrates a fabrication method of the pixel 22. First, as illustrated in FIG. 9(A), the element isolation region 122F is formed with a depth of about 100 to 300 nm in the epitaxial growth layer 122B. The element isolation region 122F includes, for example, silicon oxide. The epitaxial growth layer 122B includes P-type Si. The P-type impurity concentration of the epitaxial growth layer 122B is about $1 \times 10^{16}$ cm$^{-3}$ to $1 \times 10^{18}$ cm. Here, isolation of the photodiodes PD is provided with the use of the P-type epitaxial growth layer 122B, but the photodiodes PD may be isolated by P-type impurity implantation with the use of the thin P-type epitaxial growth layer 122B. In another alternative, the N-type epitaxial growth layer 122B may be used, in which case the photodiodes PD are isolated by the P-type impurity implantation as well.

Figure 9C:
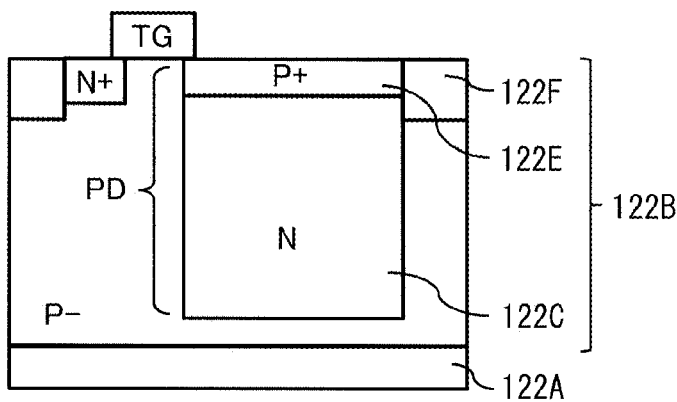
FIG. 9C is a view of an example of the procedure of manufacture following FIG. 9B.
Figure 9D:
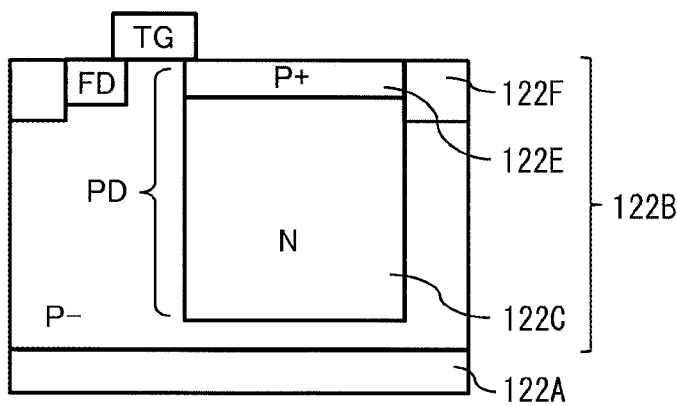
FIG. 9D is a view of an example of the procedure of manufacture following FIG. 9C.
Figure 9E:
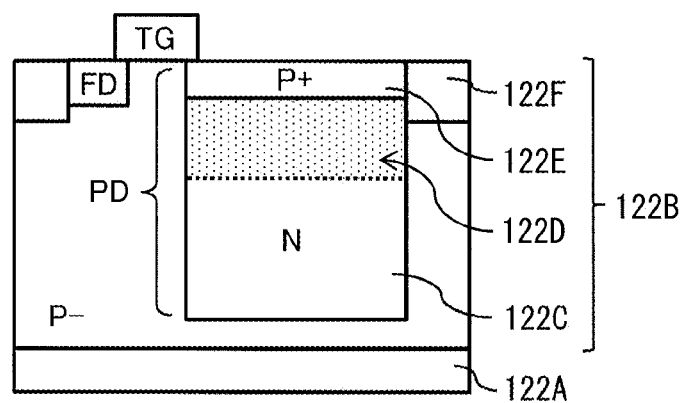
FIG. 9E is a view of an example of the procedure of manufacture following FIG. 9D.

Thereafter, by a thermal oxidation process, an oxide film of about 3 to 10 nm is formed over a surface of the epitaxial growth layer 122B. Furthermore, polysilicon is formed that is supposed to serve as a gate electrode. Thereafter, with the use of a lithography process and an etching process to make a desired shape, the transfer transistor TG is formed (FIG. 9(B)). Thereafter, the N region 122C and the P region 122E that are supposed to serve as the photodiode PD are formed by impurity implantation (FIG. 9(B)). In the N region 122C, the N-type impurity concentration is about $1 \times 10^{16}$ cm$^{-3}$ to $1 \times 10^{18}$ cm, and a depth is about 1 to 5 μm. In the P region 122E, the P-type impurity concentration is about $1 \times 10^{16}$ cm$^{-3}$ to $1 \times 10^{19}$ cm, and a depth is about 30 nm to 200 nm. Thereafter, as illustrated in FIG. 9(C), implantation of the N-type impurity is carried out into a region in which the floating diffusion section FD is to be formed, aiming at the N-type impurity concentration of about $1 \times 10^{19}$ cm$^{-3}$ to $1 \times 10^{20}$ cm. Thereafter, activation annealing is carried out at about 1000° C. to 1100° C. for about 1 second to 10 seconds. Thus, as illustrated in FIG. 9(D), the floating diffusion section FD is formed. Thereafter, as illustrated in FIG. 9(E), Al and N implantation is carried out, aiming at about $1 \times 10^{16}$ cm$^{-3}$ to $1 \times 10^{19}$ cm. Acceleration energy is about 5 keV to 50 keV. Thereafter, annealing at about 400° C. to 500° C. is carried out for about 20 hours to 200 hours. Thus, the IET region 122D is formed in the region including the junction region of the P region 122E and the N region 122C. In this way, it is possible to fabricate the desired pixel 22 as illustrated in FIG. 8, making it possible to achieve the imaging device 2 having high sensitivity particularly to light of the infrared region.

[Effects]

In this embodiment, the IET region 122D is provided in the region in which the depletion region 122G is to be formed. Thus, the electrons are trapped in the IET region 122D, which provides the rough determination of the locations where the electrons are present. This causes expansion of k space by Heisenberg's uncertainty principle. As a result, the direct-transition-like generation is carried out, leading to the enhancement in the photoelectric conversion efficiency. This renders it unnecessary to thicken the semiconductor layer 122. Hence, it is possible to enhance the sensitivity at low costs.

In this embodiment, the substrate 122A and the epitaxial growth layer 122B include Si, Ge, or the mixed crystal thereof. Furthermore, the IET region 122D includes Al and N as the impurities. Thus, as is clear from the result of FIG. 3, the direct-transition-like generation is effectively carried out, leading to the enhancement in the photoelectric conversion efficiency. This renders it unnecessary to thicken the semiconductor layer 122. Hence, it is possible to enhance the sensitivity at low costs.

In this embodiment, the P-N junction region of the photodiode PD is formed along the stacking direction in the semiconductor layer 122. Here, the IET region 122D is formed by the ion implantation. Thus, setting the implantation energy makes it possible to form the IET region 122D with respect to the P-N junction region that is distributed along the in-plane direction of the stacked layers. This renders it unnecessary to thicken the semiconductor layer 122. Hence, it is possible to enhance the sensitivity at low costs.

Figure 10:
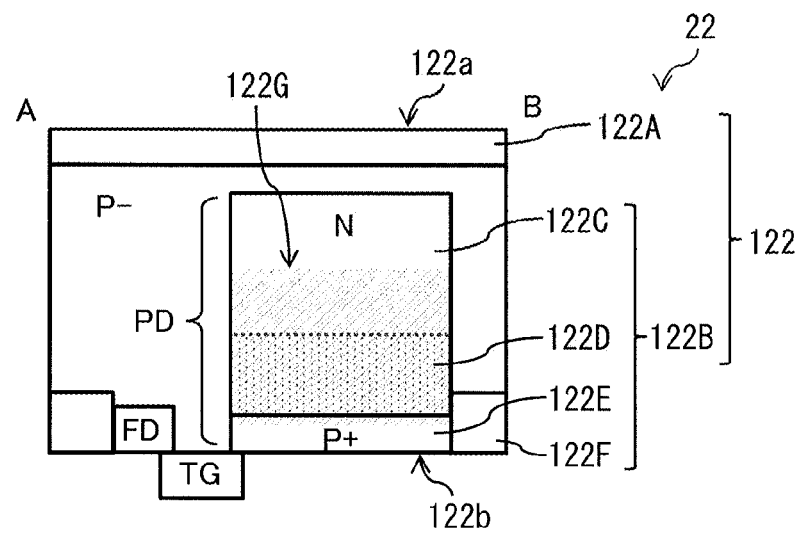
FIG. 10 is a view of an example of a cross-sectional configuration of the pixel in FIG. 5.

In this embodiment, in the photoelectric conversion element 1, for example, as illustrated in FIG. 10, a surface of the semiconductor layer 122 on side on which the N region 122C is disposed may serve as the light receiving surface 122a (first main surface). Furthermore, a surface of the semiconductor layer 122 on side on which the P region 122E is disposed may serve as the bottom surface 122b (second main surface). At this occasion, the photodiode PD includes the P region 122E (cathode region) on the bottom surface 122b (second main surface). Furthermore, the IET region 122D is formed near the P region 122E (cathode region) formed on the bottom surface 122b. In this case as well, the IET region 122D is provided in the region in which the depletion region 122G is to be formed by voltage application to the semiconductor layer 122. Hence, it is possible to enhance the sensitivity at low costs.

Figure 11:
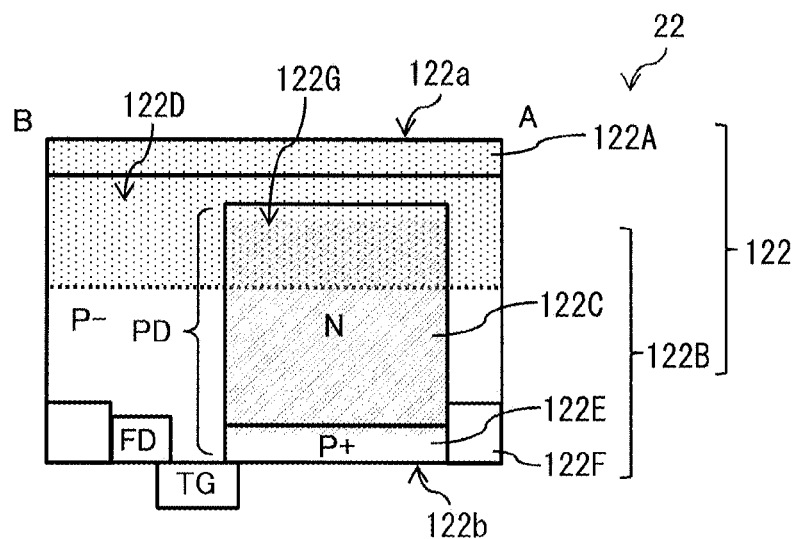
FIG. 11 is a view of an example of the cross-sectional configuration of the pixel in FIG. 5.

In the imaging device 2 illustrated in FIG. 10, for example, as illustrated in FIG. 11, the IET region 122D may be formed on the light receiving surface 122a (first main surface). At this occasion, the IET region 122D is also formed at a position at which the depletion region 122G is to be formed by the voltage application to the semiconductor layer 122. Hence, it is possible to enhance the sensitivity at low costs.

Figure 12:
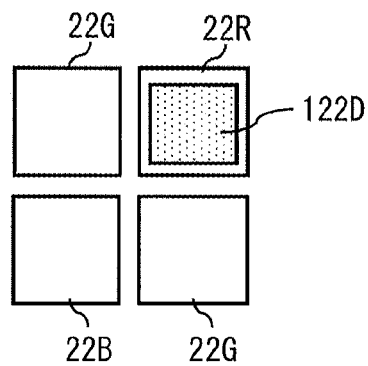
FIG. 12 is a view of an example of disposition of an IET region.
Figure 13:
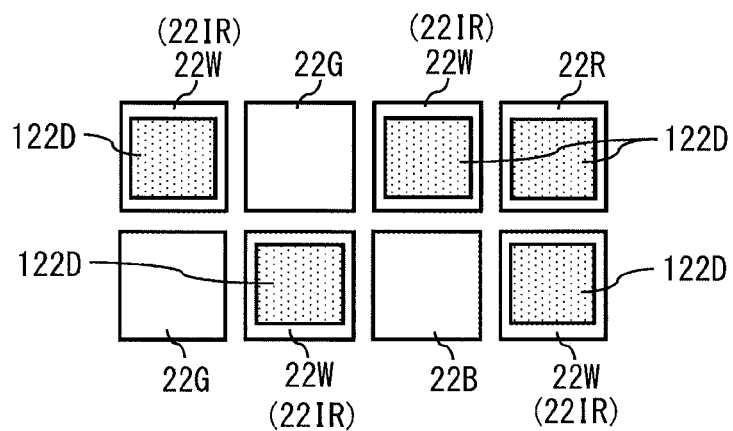
FIG. 13 is a view of an example of the disposition of the IET regions.

FIGS. 12 and 13 illustrate examples of disposition of the IET regions 122D. The imaging device 2 may include a color filter array at a position facing the pixel region 21. In the color filter array, color filters of predetermined colors are allotted to respective ones of the pixels 22. The color filter array has, for example, a Bayer array including an RGB array. At this occasion, in the color filter array, for example, red color filters, green color filters, and blue color filters constitute the Bayer array. The color filter array may have, for example, an RGBW array. At this occasion, in the color filter array, for example, red color filters, green color filters, blue color filters, and white color filters constitute the Bayer array. Moreover, the color filter array may have, for example, an RGBIR array. At this occasion, in the color filter array, for example, red color filters, green color filters, blue color filters, and infrared color filters constitute the Bayer array.

Figure 14:
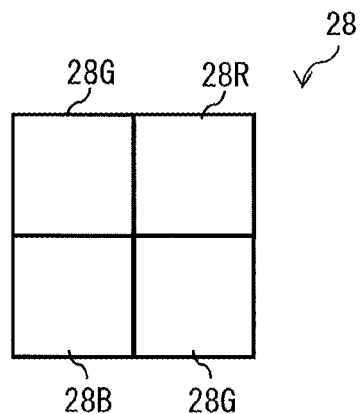
FIG. 14 is a view of an example of a color filler array.

The imaging device 2 includes, for example, as illustrated in FIG. 14, a color filter array 28 of a plurality of colors, on side on which the light receiving surface 122a is disposed. The color filter array 28 includes at least red color filters 28R. In the color filter array 28, for example, the red color filters 28R, green color filters 28G, and blue color filters 28B constitute the Bayer array. The IET region 122D is formed at least at a position facing a corresponding one of the red color filters 28R (red pixels 22R).

In this case, it is possible to enhance sensitivity to, at least, red light. Here, assume that the color filter array 28 includes at least the blue color filters 28B, in addition to the red color filters 28R. At this occasion, the IET region 122D is preferably formed to avoid at least positions facing the respective blue color filters 28B (blue pixels 22B). This makes it possible to suppress an increase in a dark current because of the IET region 122D, in the blue pixels 22B.

In FIG. 13, the IET region 122D is formed at a position of entrance of, at least, white light, infrared light, or near infrared light (white pixel 22W, red pixel 22R, or infrared or near infrared pixel 22IR). In this case, it is possible to enhance sensitivity to, at least, the white light, the infrared light, or the near infrared light.

In this embodiment, the substrate 122A and the epitaxial growth layer 122B may include an N-type semiconductor. In this case, an electrical-conductivity type of each constituent element inside the epitaxial growth layer 122B as mentioned above becomes an opposite electrical-conductivity type. Thus, even in a case with the opposite electrical-conductivity type to the forgoing description, the direct-transition-like generation is effectively carried out, leading to the enhancement in the photoelectric conversion efficiency. This renders it unnecessary to thicken the semiconductor layer 122. Hence, it is possible to enhance the sensitivity at low costs.

3. Third Embodiment

[Configuration]

Figure 15:
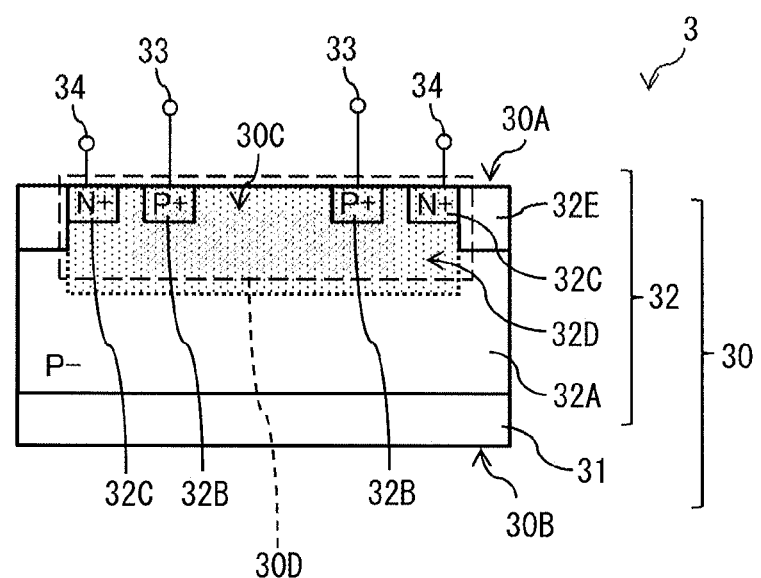
FIG. 15 is a view of an example of a cross-sectional configuration of a photoelectric conversion element according to a third embodiment of the disclosure.

FIG. 15 illustrates an example of a cross-sectional configuration of a photoelectric conversion element 3 according to a third embodiment of the disclosure. The photoelectric conversion element 3 includes a photoelectric conversion region 30D inside a semiconductor layer 30. The photoelectric conversion region 30D includes a region in which a depletion region 30C is to be formed by voltage application from outside. In the depletion region 30C, strictly speaking, there are holes that perform electric field modulation, but its concentration is sufficiently smaller than, for example, that in a P+ region 32B described later. Moreover, the depletion region 30C is a region nearly devoid of electrons. The depletion region 30C converts light into a photoelectron, in which the light enters from side on which a light receiving surface 30A (first main surface) is disposed. The photoelectric conversion region 30D generates the depletion region 30C by voltage application to the photoelectric conversion region 30D. Upon the light entering the depletion region 30C generated, the photoelectric conversion region 30D converts the photoelectron generated in the depletion region 30C, into a photocurrent. The photoelectric conversion element 3 further includes an IET region 32D in a region in which the depletion region 30C is to be formed.

The photoelectric conversion element 3 includes the semiconductor layer 30 having the light receiving surface 30A and a bottom surface 30B (second main surface) The semiconductor layer 30 includes a substrate 31 and an epitaxial growth layer 32. The substrate 31 constitutes the bottom surface 30B, The epitaxial growth layer 32 constitutes the light receiving surface 30A. The substrate 31 serves as a growth substrate in forming the epitaxial growth layer 32 by the epitaxial crystal growth method in a manufacture process. The epitaxial growth layer 32 is formed by the epitaxial crystal growth method, with the substrate 31 serving as the growth substrate. The substrate 31 and the epitaxial growth layer 32 include, for example, the semiconductor of the indirect transition type, e.g., silicon (Si), germanium (Ge) or a mixed crystal thereof. It is to be noted that in some cases, the substrate 31 is removed by polishing in the manufacture process.

In the following, described is each constituent element formed inside the epitaxial growth layer 32, on an assumption that the substrate 31 and the epitaxial growth layer 32 include a P-type semiconductor.

The epitaxial growth layer 32 includes a P region 32A in a region including the light receiving surface 30A. The P region 12A includes a P-type semiconductor, and has, for example, a P-type impurity concentration (e.g., $1 \times 10^{16}$ cm$^{-3}$ to $1 \times 10^{18}$ cm$^{-3}$) lower than a P-type impurity concentration of the substrate 31. The epitaxial growth layer 32 includes a pair of the P+ regions 32B (first impurity regions) formed in the light receiving surface 30A with a predetermined spacing. The epitaxial growth layer 32 further includes a pair of N regions 32C (second impurity regions) formed in the light receiving surface 30A, with the pair of the P+ regions 32B interposed between the pair of the N regions 32C. The pair of the P+ regions 32B and the pair of the N regions 32C are formed in the P region 32A.

The pair of the P+ regions 32B include a P-type semiconductor having an identical electrical-conductivity type to that of the P region 32A, and has, for example, a P-type impurity concentration (e.g., $1 \times 10^{18}$ cm$^{-3}$ to $1 \times 10^{19}$ cm$^{-3}$) higher than a P-type impurity concentration of the P region 32A. The pair of the N regions 32C include an N-type semiconductor having a different electrical-conductivity type from that of the P region 32A, and has, for example, an N-type impurity concentration of about $1 \times 10^{15}$ cm$^{-3}$ to $5 \times 10^{18}$ cm$^{-3}$. Application of pulsed voltages having reverse phases to each other to the pair of the P+ regions 32B causes periodic changes in a direction of an electric field inside the P region 32A. Thus, the depletion region 30C is generated in a region interposed between the pair of the P+ regions 32B, within the P region 32A. Furthermore, electrons and holes generated in the depletion region 30C are distributed along a direction of the electric field, by the electric field whose direction changes periodically. The electrons distributed are captured by the pair of the N regions 32C including the N-type semiconductor. Thus, the photoelectric conversion region 30D is formed by a region near the light receiving surface 30A within the P region 32A, the pair of the P+ regions 32B, and the pair of the N regions 32C.

The epitaxial growth layer 32 includes an element isolation region 32E in a region other than the P region 32A within the light receiving surface 30A. The element isolation region 32E includes, for example, silicon oxide. The photoelectric conversion element 3 includes a pair of guide electrodes 33 that are electrically coupled to respective ones of the pair of the P+ regions 32B. The photoelectric conversion element 3 further includes a pair of detection electrodes 34 that are electrically coupled to respective ones of the pair of the N regions 32C. The pair of the guide electrodes 33 apply the electric field whose direction changes periodically, to the P region 32A through the pair of the P+ regions 32B. The pair of the N regions 32C capture electrons generated in the P+ regions 32B.

The epitaxial growth layer 32 further includes the IET region 32D in the region in which the depletion region 30C is to be formed. The IET region 32D is formed on the light receiving surface 30A, specifically at least in the spacing between the pair of the P+ regions 32B within the P region 32A. The IET region 32D includes aluminum (Al) and nitrogen (N) as impurities. The IET region 32D is formed, for example, by carrying out ion implantation of aluminum (Al) and nitrogen (N) into the epitaxial growth layer 32 at about $1 \times 10^{16}$ cm$^3$ to $1 \times 10^{19}$ cm$^3$, and thereafter, long-time annealing at a temperature of 450° C. for about 20 hours to 250 hours. This long-time annealing causes the formation of the localized level by the Al—N pair.

[Effects]

In this embodiment, the IET region 32D is provided in the region in which the depletion region 30C is to be formed. Thus, the electrons are trapped in the IET region 32D, which provides the rough determination of the locations where the electrons are present. This causes expansion of k space by Heisenberg's uncertainty principle. As a result, the direct-transition-like generation is carried out, leading to the enhancement in the photoelectric conversion efficiency. This renders it unnecessary to thicken the semiconductor layer 30. Hence, it is possible to enhance sensitivity at low costs.

In this embodiment, the substrate 31 and the epitaxial growth layer 32 include Si, Ge, or the mixed crystal thereof. Further, the IET region 12C includes Al and N as the impurities. Thus, as is clear from the result of FIG. 3 as well, the direct-transition-like generation is effectively carried out, leading to the enhancement in the photoelectric conversion efficiency. This renders it unnecessary to thicken the semiconductor layer 10. Hence, it is possible to enhance the sensitivity at low costs.

In this embodiment, the substrate 31 and the epitaxial growth layer 32 may include an N-type semiconductor. In this case, an electrical-conductivity type of each constituent element inside the epitaxial growth layer 32 as mentioned above becomes an opposite electrical-conductivity type. Thus, even in a case with the opposite electrical-conductivity type to the forgoing description, the direct-transition-like generation is effectively carried out, leading to the enhancement in the photoelectric conversion efficiency. This renders it unnecessary to thicken the semiconductor layer 30. Hence, it is possible to enhance the sensitivity at low costs.

The photoelectric conversion element 3 of this embodiment may be used instead of the photodiode PD in the imaging device 2 of the second embodiment. In this case as well, it is possible to achieve the imaging device 2 having the high sensitivity at low costs.

4. Fourth Embodiment

[Configuration]

Figure 16:
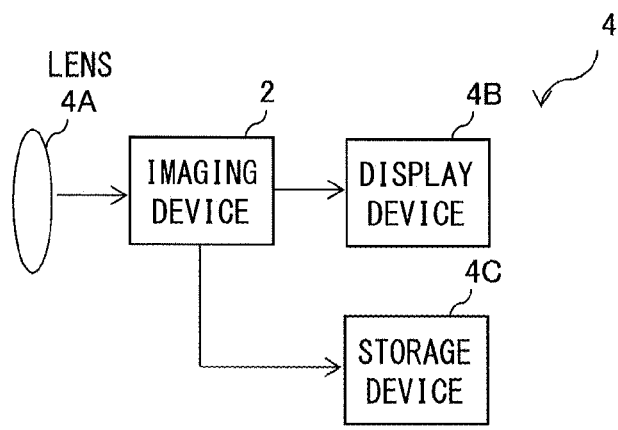
FIG. 16 is a diagram illustrating an example of a schematic configuration of an imaging system according to a fourth embodiment of the disclosure.

FIG. 16 illustrates an example of a schematic configuration of an imaging system 4 according to a fourth embodiment of the disclosure. The imaging system 4 includes the imaging device 2 of the forgoing second embodiment. The imaging system 4 includes, for example, the imaging device 2, a lens 4A, a display device 4B, and a storage device 4C. The lens 4A allows outside light to enter the imaging device 2. The display device 4B displays an output of the imaging device 2 as a picture. The storage device 4C stores the output of the imaging device 2. It is to be noted that the display device 4B or the storage device 4C may be omitted as necessary.

In this embodiment, the imaging device 2 is mounted. Hence, it is possible to provide the imaging system 4 having high sensitivity at low cost.

5. Fifth Embodiment

[Configuration]

Figure 17:
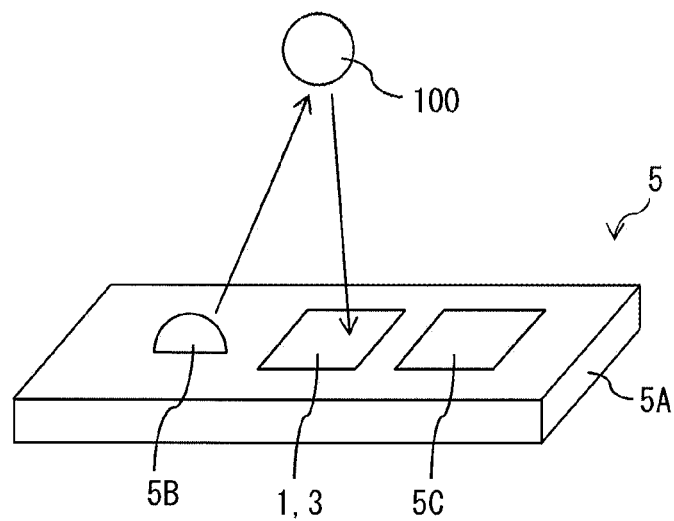
FIG. 17 is a view of an example of a schematic configuration of a distance measurement device according to a fifth embodiment of the disclosure.

FIG. 17 illustrates an example of a schematic configuration of a distance measurement device 5 according to a fifth embodiment of the disclosure. The distance measurement device 5 measures a distance to a test object 100 by a TOF (Time Of Flight) method. The distance measurement device 5 includes, for example, on a circuit substrate 5A, a light emitting element 5B (light source), one or more photoelectric conversion elements, and a signal processing circuit 5C. The one or more photoelectric conversion elements provided in the distance measurement device 5 includes the photoelectric conversion elements 1 or the photoelectric conversion elements 3 (hereinafter referred to as "photoelectric conversion elements 1 or 3").

The light emitting element 5B sends out pulsed light on the basis of a pulsed drive voltage inputted from the signal processing circuit 5C. The light emitting element 5B sends out infrared light or near infrared light. The photoelectric conversion elements 1 or 3 detect reflected light from the test object 100 to generate a pulsed photocurrent, and output the photocurrent to the signal processing circuit 5C. The signal processing current 5C includes, for example, a driver circuit and an I-V conversion circuit. The driver circuit drives the one or more photoelectric conversion elements 1 or 3 and the light emitting element 5B. The I-V conversion circuit converts the pulsed photocurrent inputted from the photoelectric conversion elements 1 or 3 into a pulsed voltage. The driver circuit provided in the signal processing circuit 5C causes synchronization of drive of the one or more photoelectric conversion elements 1 or 3 and the light emitting element 5B. The signal processing circuit 5C further includes, for example, a distance derivation circuit (distance derivation section) that derives the distance to the test object 100 on the basis of a phase difference (deviation in rise timing) between the pulsed voltage obtained by the I-V conversion circuit and the pulsed drive voltage to be outputted to the light emitting element 5B. The distance derivation circuit derives the distance to the test object 100 on the basis of the voltage obtained from the one or more photoelectric conversion elements 1 or 3 and on the basis of the drive voltage that drives the light emitting element 5B.

In this embodiment, the imaging device 2 is mounted. Hence, it is possible to provide the distance measurement device 5 having high sensitivity at low cost.

Although description has been made by giving a plurality of example embodiments as mentioned above, the contents of the disclosure are not limited to the above-mentioned example embodiments and may be modified in a variety of ways. It is to be noted that the effects described herein are merely illustrative and non-limiting. Effects to be achieved by the disclosure are not limited to the effects described herein. The disclosure may have other effects than those described herein.

6. Applied Example to Mobile Body

The technology according to the disclosure (the technology) is applicable to various products. For example, the technology according to the disclosure may be implemented as a device to be mounted on any kind of mobile body such as an automobile, an electric vehicle, a hybrid electric vehicle, a motorcycle, a bicycle, a personal mobility, an airplane, a drone, a vessel, and a robot.

Figure 18:
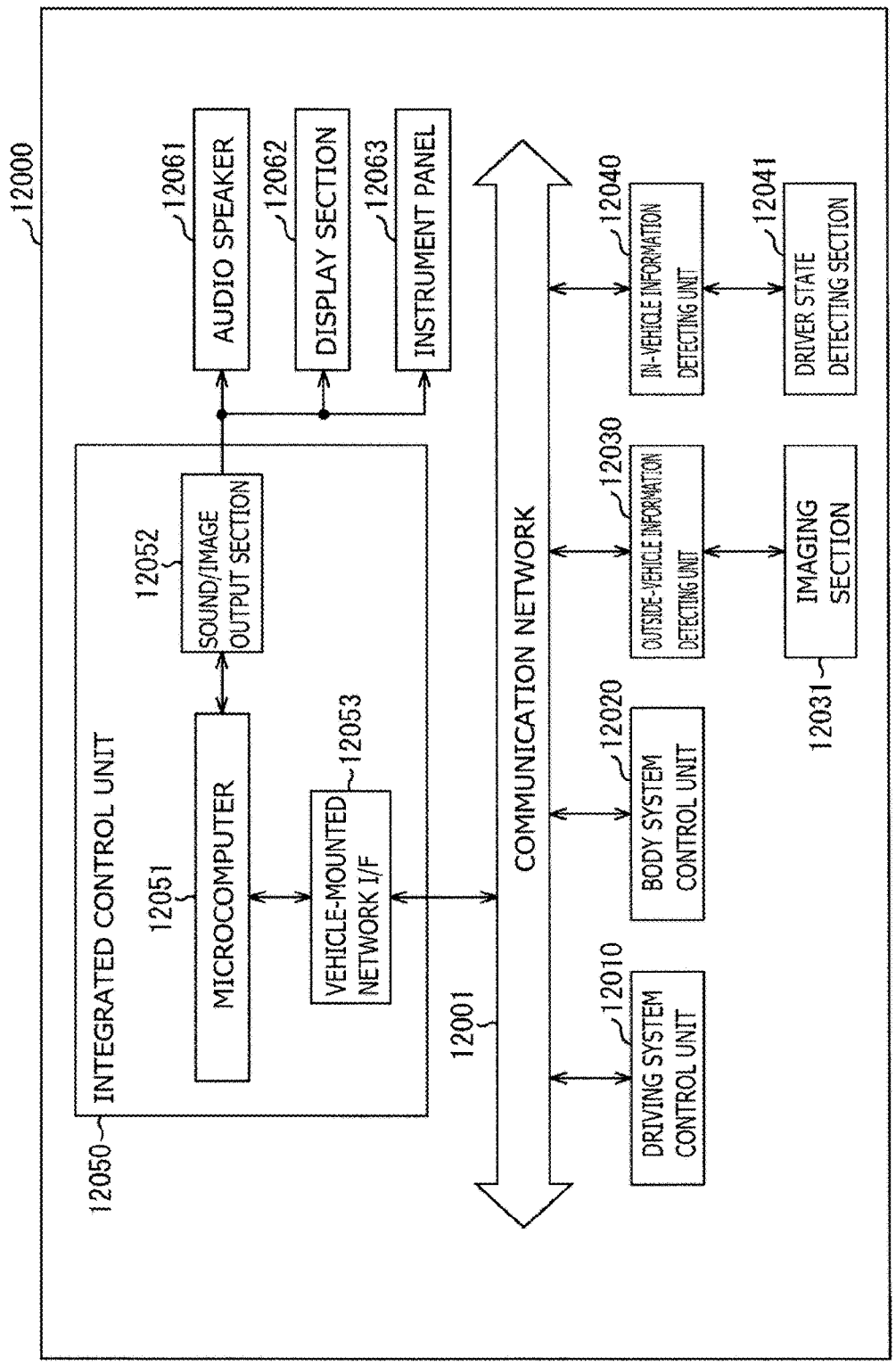
FIG. 18 is a block diagram depicting an example of schematic configuration of a vehicle control system.

FIG. 18 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 18, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 18, an audio speaker 12061, a display section 12062, and an instrument panel 12063 are illustrated as the output device. The display section 12062 may, for example, include at least one of an on-board display and a head-up display.

Figure 19:
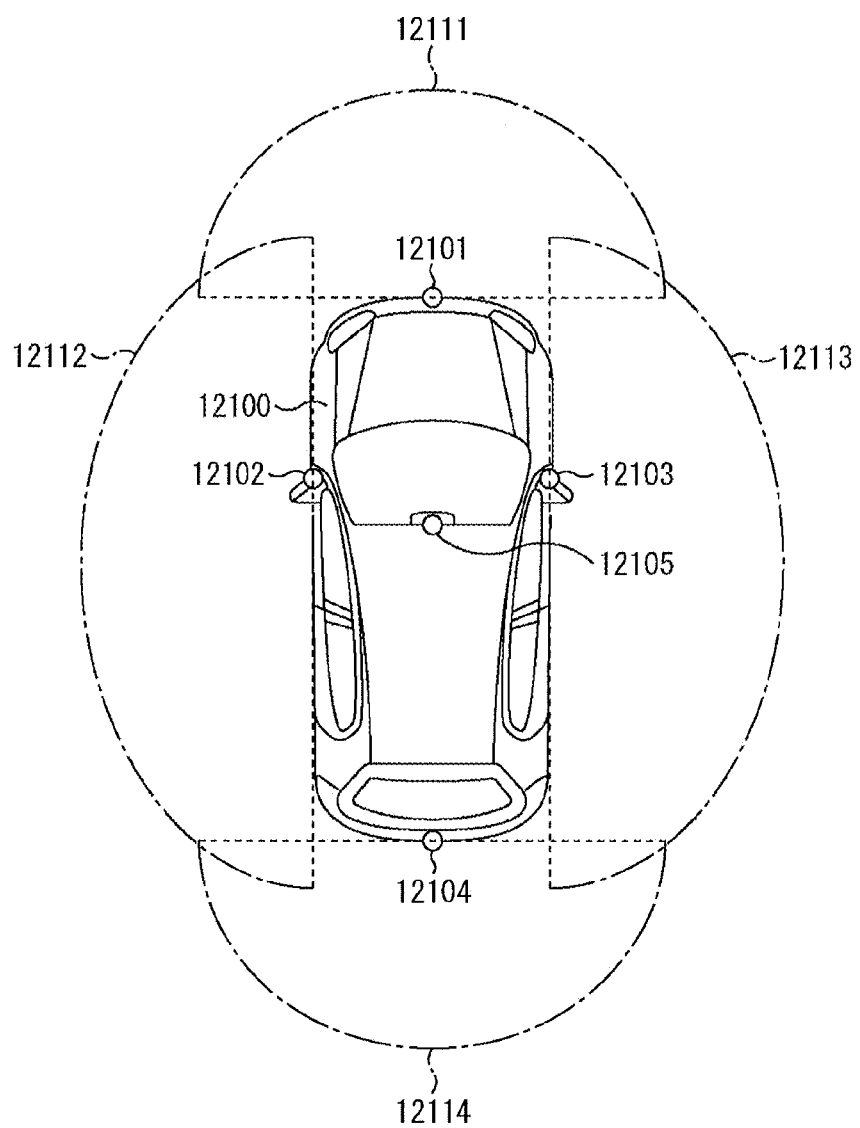
FIG. 19 is a diagram of assistance in explaining an example of installation positions of an outside-vehicle information detecting section and an imaging section.

FIG. 19 is a diagram depicting an example of the installation position of the imaging section 12031.

In FIG. 19, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 19 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identities obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the forgoing, the description has been given of one example of the vehicle control system to which the technology according to an embodiment of the disclosure can be applied. The technology according to the disclosure may be applied to the imaging section 12031 among the components of the configuration described above. Applying the technology according to the disclosure to the imaging section 12031 makes it possible to obtain a photographed image having high sensitivity at low costs.

Moreover, for example, the disclosure may have the following configurations.

(1)

A photoelectric conversion element including a photoelectric conversion region inside a semiconductor layer, the photoelectric conversion region including a region in which a depletion region is to be formed by voltage application to the semiconductor layer, the semiconductor layer having a first main surface and a second main surface, the depletion region converting light into a photoelectron, the light entering from side on which the first main surface is disposed, the photoelectric conversion element further including an isoelectronic trap region in the region in which the depletion region is to be formed.

(2)

The photoelectric conversion element according to (1), in which the semiconductor layer includes silicon, germanium, or a mixed crystal thereof.

(3)

The photoelectric conversion element according to (1) or (2), in which the isoelectronic trap region includes aluminum and nitrogen as impurities.

(4)

The photoelectric conversion element according to any one (1) to (3), in which the photoelectric conversion region includes a photodiode in which a P-N structure or a P-I-N structure is formed in a stacking direction in the semiconductor layer.

(5)

The photoelectric conversion element according to (4), in which the photodiode includes a cathode region on the first main surface.

(6)

The photoelectric conversion element according to (4), in which the photodiode includes a cathode region on the second main surface.

(7)

The photoelectric conversion element according to (6), in which the isoelectronic trap region is formed near the cathode region formed on the second main surface.

(8)

The photoelectric conversion element according to (6), in which the isoelectronic trap region is formed on the first main surface.

(9)

The photoelectric conversion element according to any one of (1) to (3), further including:

a pair of first impurity regions formed in the first main surface with a predetermined spacing, the pair of the first impurity regions having an identical electrical-conductivity type to an electrical-conductivity type of the semiconductor layer and having a relatively high impurity concentration; and a pair of second impurity regions formed in the first main surface, with the pair of the first impurity regions interposed between the pair of the second impurity regions, the pair of the second impurity regions having a different electrical-conductivity type from the electrical-conductivity type of the semiconductor layer, in which the isoelectronic trap region is formed at least in the spacing between the pair of the first impurity regions.

(10)

A photoelectric conversion device including:

one or more photoelectric conversion elements; and a driver section that drives the one or more photoelectric conversion elements, the one or more photoelectric conversion elements each including a photoelectric conversion region inside a semiconductor layer, the photoelectric conversion region including a region in which a depletion region is to be formed by voltage application to the semiconductor layer, the semiconductor layer having a first main surface and a second main surface, the depletion region converting light into a photoelectron, the light entering from side on which the first main surface is disposed, the one or more photoelectric conversion elements each further including an isoelectronic trap region in the region in which the depletion region is to be formed.

(11)

The photoelectric conversion device according to (10), in which the photoelectric conversion device includes a plurality of the photoelectric conversion elements, and the plurality of the photoelectric conversion elements share the semiconductor layer with one another, and are two-dimensionally disposed in the first main surface of the semiconductor layer shared by the plurality of the photoelectric conversion elements.

(12)

The photoelectric conversion device according to (11), further including a color filter array of a plurality of colors, the color filter array including at least red color filters, in which the isoelectronic trap region is formed at least at a position facing a corresponding one of the red color filters.

(13)

The photoelectric conversion device according to (12), in which the color filter array includes at least blue color filters in addition to the red color filters, and the isoelectronic trap region is formed to avoid at least positions facing the respective blue color filters.

(14)

The photoelectric conversion device according to any one of (11) to (13), in which the isoelectronic trap region is formed at each of positions of entrance of, at least, white light, infrared light, or near infrared light.

(15)

The photoelectric conversion device according to (10), in which the one or more photoelectric conversion elements each further include:

a pair of first impurity regions formed in the first main surface with a predetermined spacing, the pair of the first impurity regions having an identical electrical-conductivity type to an electrical-conductivity type of the semiconductor layer and having a relatively high impurity concentration; and a pair of second impurity regions formed in the first main surface, with the pair of the first impurity regions interposed between the pair of the second impurity regions, the pair of the second impurity regions having a different electrical-conductivity type from the electrical-conductivity type of the semiconductor layer, the isoelectronic trap region being formed at least in the spacing between the pair of the first impurity regions, and the driver section applying pulsed voltages having reverse phases to each other to the pair of the first impurity regions.

(16)

The photoelectric conversion device according to (15), further including:

a light source that sends out infrared light or near infrared light; and a distance derivation section that derives a distance to a test object on the basis of a voltage obtained from the one or more photoelectric conversion elements and on the basis of a drive voltage that drives the light source.

This application is based upon and claims priority from Japanese Patent Application No. 2016-067647 filed with the Japan Patent Office on Mar. 30, 2016, the entire contents of which are hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photoelectric conversion element, comprising:
   a photoelectric conversion region inside a semiconductor layer,
   the photoelectric conversion region including a region in which a depletion region is to be formed by voltage application to the semiconductor layer,
   the semiconductor layer having a first main surface and a second main surface, the depletion region converting light into a photoelectron, and
   the light entering from a side on which the first main surface is disposed;
   an isoelectronic trap region in the region in which the depletion region is to be formed;
   a pair of first impurity regions formed in the first main surface with a predetermined spacing, the pair of the first impurity regions having an identical electrical-conductivity type to an electrical-conductivity type of the semiconductor layer and having a relatively high impurity concentration; and
   a pair of second impurity regions formed in the first main surface, with the pair of the first impurity regions interposed between the pair of the second impurity regions, the pair of the second impurity regions having a different electrical-conductivity type from the electrical-conductivity type of the semiconductor layer,
   wherein the isoelectronic trap region is formed at least in the spacing between the pair of the first impurity regions.

2. The photoelectric conversion element according to claim 1, wherein the semiconductor layer includes silicon, germanium, or a mixed crystal thereof.

3. The photoelectric conversion element according to claim 2, wherein the isoelectronic trap region includes aluminum and nitrogen as impurities.

4. The photoelectric conversion element according to claim 1, wherein the photoelectric conversion region comprises a photodiode in which a P-N structure or a P-I-N structure is formed in a stacking direction in the semiconductor layer.

5. The photoelectric conversion element according to claim 4, wherein the photodiode includes a cathode region on the first main surface.

6. The photoelectric conversion element according to claim 1, further comprising an element isolation region provided on the first main surface and above the isoelectronic trap region.

7. The photoelectric conversion element according to claim 6, wherein the element isolation region includes silicon oxide.

8. A photoelectric conversion device, comprising:
   one or more photoelectric conversion elements; and
   a driver section that drives the one or more photoelectric conversion elements,
   wherein the one or more photoelectric conversion elements each including:
   a photoelectric conversion region inside a semiconductor layer,
   the photoelectric conversion region including a region in which a depletion region is to be formed by voltage application to the semiconductor layer,
   the semiconductor layer having a first main surface and a second main surface,
   the depletion region converting light into a photoelectron, and
   the light entering from a side on which the first main surface is disposed,
   an isoelectronic trap region in the region in which the depletion region is to be formed;
   a pair of first impurity regions formed in the first main surface with a predetermined spacing, the pair of the first impurity regions having an identical electrical-conductivity type to an electrical-conductivity type of the semiconductor layer and having a relatively high impurity concentration; and
   a pair of second impurity regions formed in the first main surface, with the pair of the first impurity regions interposed between the pair of the second impurity regions, the pair of the second impurity regions having a different electrical-conductivity type from the electrical-conductivity type of the semiconductor layer,
   wherein the isoelectronic trap region being formed at least in the spacing between the pair of the first impurity regions, and
   wherein the driver section applying pulsed voltages having reverse phases to each other to the pair of the first impurity regions.

9. The photoelectric conversion device according to claim 8, wherein the one or more photoelectric conversion elements include a plurality of photoelectric conversion elements, and
   wherein the plurality of the photoelectric conversion elements share the semiconductor layer with one another and are two-dimensionally disposed in the first main surface of the semiconductor layer shared by the plurality of the photoelectric conversion elements.

10. The photoelectric conversion device according to claim 9, further comprising:
    a color filter array of a plurality of colors, the color filter array including at least red color filters,
    wherein the isoelectronic trap region is formed at least at a position facing a corresponding one of the red color filters.

11. The photoelectric conversion device according to claim 10, wherein the color filter array includes at least blue color filters in addition to the red color filters, and
    wherein the isoelectronic trap region is formed to avoid at least positions facing the respective blue color filters.

12. The photoelectric conversion device according to claim 9, wherein the isoelectronic trap region is formed at each of positions of an entrance of, at least, white light, infrared light, or near infrared light.

13. The photoelectric conversion device according to claim 8, further comprising:
    a light source that sends out infrared light or near infrared light; and
    a distance derivation section that derives a distance to a test object on a basis of a voltage obtained from the one or more photoelectric conversion elements and on a basis of a drive voltage that drives the light source.

14. The photoelectric conversion device according to claim 8, further comprising element isolation regions provided on the first main surface and above the isoelectronic trap region, the element isolation regions electrically isolating adjacent photoelectric conversion elements from each other.

15. The photoelectric conversion device according to claim 14, wherein the element isolation regions include silicon oxide.

\* \* \* \* \*